US006377061B1

(12) United States Patent
Settle et al.

(10) Patent No.: US 6,377,061 B1
(45) Date of Patent: Apr. 23, 2002

(54) EXPANDED LEAD PITCH FOR SEMICONDUCTOR PACKAGE AND METHOD OF ELECTRICAL TESTING

(75) Inventors: Kirk F. Settle, Sherman; Don E. Noble, Jr., Denison, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/206,689

(22) Filed: Dec. 7, 1998

Related U.S. Application Data

(60) Provisional application No. 60/069,588, filed on Dec. 12, 1997.

(51) Int. Cl.$^7$ .......................... G01R 31/02; G01R 31/26
(52) U.S. Cl. ..................... 324/755; 324/760; 324/765
(58) Field of Search ............................... 324/755, 756, 324/760, 765

(56) References Cited

U.S. PATENT DOCUMENTS

| | | | | |
|---|---|---|---|---|
| 3,810,016 A | * | 5/1974 | Chayka et al. | 324/762 |
| 4,962,356 A | * | 10/1990 | Eberlein et al. | 324/755 |
| 5,086,269 A | * | 2/1992 | Nobi | 324/760 |
| 5,176,525 A | * | 1/1993 | Nierescher et al. | 324/755 |
| 5,245,277 A | * | 9/1993 | Nguyen | 324/761 |
| 5,247,248 A | * | 9/1993 | Fukunaga | 324/760 |
| 5,517,125 A | * | 5/1996 | Posedel et al. | 324/755 |
| 5,572,144 A | * | 11/1996 | Davidson et al. | 324/755 |
| 5,610,437 A | * | 3/1997 | Frechette | 257/670 |
| 5,914,529 A | * | 6/1999 | King et al. | 257/670 |
| 6,006,424 A | * | 12/1999 | Kim et al. | 29/827 |

FOREIGN PATENT DOCUMENTS

EP 0902473 A2 * 3/1999 ......... H01L/23/495

* cited by examiner

*Primary Examiner*—Safet Metjahic
*Assistant Examiner*—Jermele M. Hollington
(74) *Attorney, Agent, or Firm*—Gary C. Honeycutt; Fred Telecky; Arthur I. Navarro

(57) ABSTRACT

The invention relates to packages of semiconductor devices, specifically of the surface mount and Quad Flat Pack families, that can be used in current semiconductor device production, and to a method of automated testing. The packages have a plurality of insulating tie bars supporting a multitude of leads. The tie bars are designed so that they comprise celectrically conductive vias in a pattern expanding the effective lead pitch for more convenient testing, without introducing unwanted side effects. The full benefit of the expanded lead pitch can be exploited during the electrical testing of the device which utilizes a test apparatus simplified for an automated testing procedure. The base of the apparatus includes a multitude of electrically conductive and mechanically elastic passageways with surface contours adapted for contacting the metallic end connectors of the semiconductor device-to-be-tested, as well as the metallic connector to the tester.

14 Claims, 4 Drawing Sheets

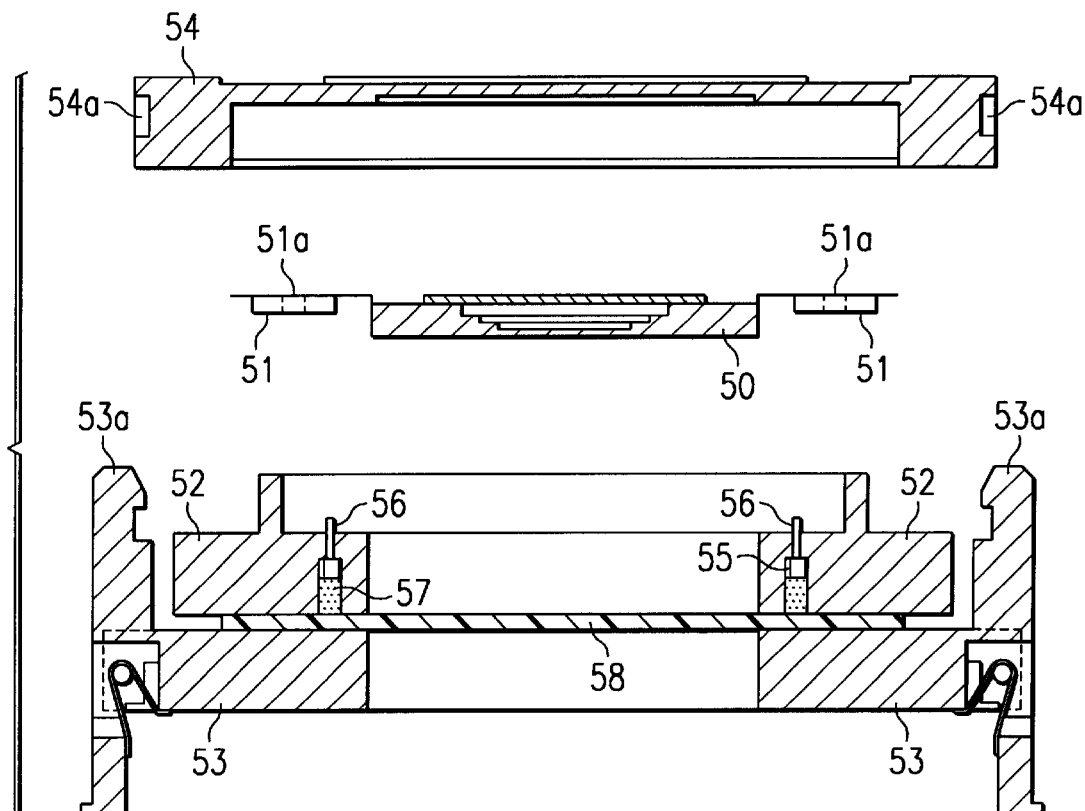
FIG. 5
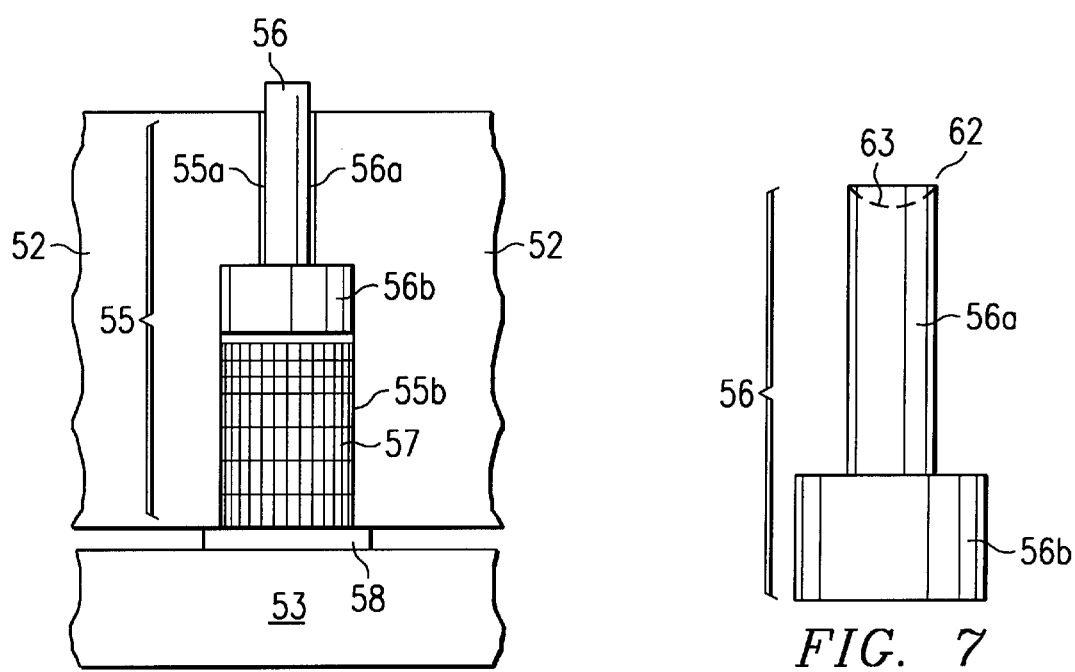
FIG. 6
FIG. 7

US 6,377,061 B1

EXPANDED LEAD PITCH FOR SEMICONDUCTOR PACKAGE AND METHOD OF ELECTRICAL TESTING

This application is a provisional of 60/069,588 filed Dec. 12, 1997.

This invention relates generally to the field of integrated circuit packages and more specifically to apparatus and methods for testing fine lead pitch semiconductor packages.

BACKGROUND OF THE INVENTION

The lead count of surface mount semiconductor devices has been increasing for many years, driven by the need for more power and signal input/output. At the same time, there has been a strong push for smaller outline of the device packages, motivated by the requirement to conserve board space in assembly. These trends are conflicting and have resulted in ever smaller pitch of the package leads. Narrower and closely spaced leads, in turn, make mechanical handling more difficult due to weakened strength and tighter proximity; they also result in distortions of electrical testing due to electrical losses and stray effects.

Known technology for the electrical testing of surface mount semiconductor devices leaves much to be desired. Most test contactors currently available for high lead count devices utilize hinged lids, attached lid devices or latches, or are mechanically actuated by mechanisms to move and engage the contacts. The extra hardware of such contactors is difficult to adapt to an automated test environment. In most applications, this limits the process to high-cost and time consuming manual test operation. In addition, the excessive contact length of most conventional contactors and their long spring-loaded contact pins introduce a high inductance path and electrical noise into the test environment. Furthermore, they make the contacts mechanically fragile. Contact manipulation with lead combs or extra alignment features in conventional contactors create electrical test problems when used with high speed semiconductor devices and are subject to excessive mechanical failure and poor device alignment. Through-hole or soldered pin methods for installation in conventional test contactors are especially cumbersome.

SUMMARY OF THE INVENTION

The invention provides improved apparatus and methods for testing fine lead pitch semiconductor packages. It has particular application to semiconductor surface mount packages, especially to multi-layer ceramic chip carriers of the quad flat pack type with ceramic tie bars. The invention enables an effective expansion of lead pitch for testing and the provision of test contactors exploiting this opportunity for easier as well as more precise testing.

It is an object of the present invention to extend the concept of automated testing to fine lead pitch semiconductor surface mount packages.

Another object of the present invention is to provide a testing method with high alignment flexibility and contact reliability while retaining lead coplanarity and avoiding stress or damage to the delicate leads.

Another object of the present invention is to provide a method for electrically truthful testing even at high frequencies, with significantly reduced test noise.

Another object of the present invention is to provide a testing method applicable to various semiconductor device families for military and commercial applications, independent of package thermal expansion properties.

Another object of the present invention is to provide a method of expanding the effective lead pitch of high lead count semiconductor packages for reliable testing.

These objects have been achieved by producing periodically staggered arrays of electrically conductive vias in low-cost ceramic tie bars needed to support fine pitch leads, and using them in a test apparatus featuring mirror-imaged staggered arrays of electrically conductive bores embedded in insulating material. These combinations have been successfully employed for automated testing of high frequency semiconductor devices.

In one embodiment of the invention, the fine pitch leads of a chip carrier are supported by tie bars made of electrically insulating material, which include conductive vias arranged in a periodically staggered array. At one surface, each via contacts one lead of the package, while at an opposite surface the via is adapted to be contacted by a metal pin provided in a test contactor. The pattern of the staggering of the vias is designed so that the contacting pins are spatially separated for electrical testing, resulting in an effective lead pitch for testing expanded two-to-flour fold compared to the actual physical lead pitch.

In another embodiment of the invention, test apparatus is provided that utilizes a low profile contact base ready to receive the device-to-be-tested. The contact base comprises electrically insulating material featuring an array of bores, each one containing an subassembly of a metallic pin activated by an elastic and electrically conductive support. The subassembly is non-selective for electrical frequency in electrical tests. The array of bores mirrors the array of conductive vias in the ceramic tie bars of the chip carrier-to-be-tested. The contact base, in turn, is positioned in a housing of electrically insulating material which consists of a base for connecting to the tester and a lid with notches, into which hinges attached to the base are clamped.

The technical advances represented by the invention, as well as the objects thereof, will become apparent from the following description of a preferred embodiment of the invention when considered in conjunction with the accompanying drawings, and the novel features set forth in the appended claims.

BRIEF DESCRIPTION OF THE DRAWINGS

FIG. 5 is an exploded view, in cross section of an embodiment of test apparatus showing the contact base before accepting the device-to-be-tested and closing the top and bottom parts of the housing.

FIG. 6 is an enlarged cross section of a part of the apparatus of FIG. 5, showing one bore in the contact base with the subassembly of a metal pin and its elastic and electrically conductive supports.

FIG. 7 illustrates details of the metal pin of FIG. 6.

FIG. 8A illustrates these subassemblies before contacting the semiconductor device and the tester, FIG. 8B illustrates the same subassemblies after contacts have been established.

FIG. 9 illustrates the top view of the contact base in FIG. 5 showing the array of bores through the base, mirror-imaging the via array in FIG. 3.

FIG. 10 illustrates the bottom view of the contact base in FIG. 5 showing the array of bores through the contact base.

DETAILED DESCRIPTION OF THE PREFERRED EMBODIMENTS

Figure 1:
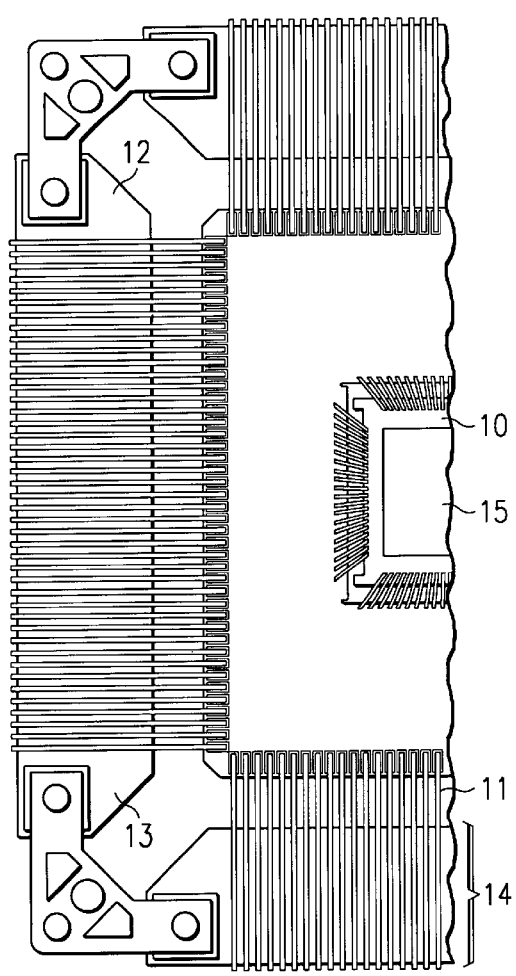
FIG. 1 is a top view of a portion of a chip carrier with a tie bar according to an embodiment of the invention.
Figure 2:
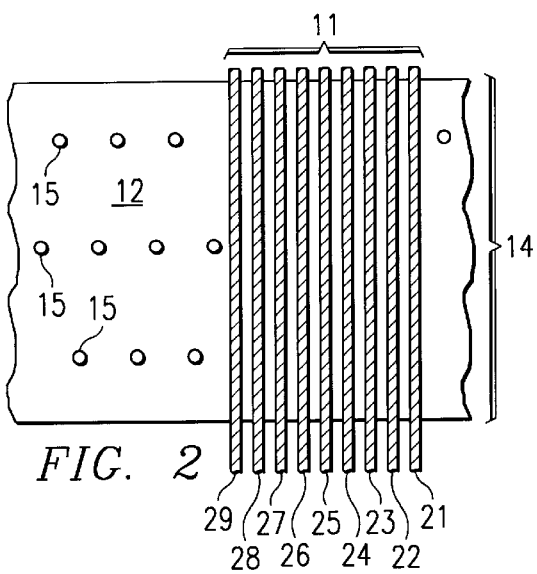
FIG. 2 is a top view of an enlarged portion of the tie bar in FIG. 1, with portions removed.
Figure 3:
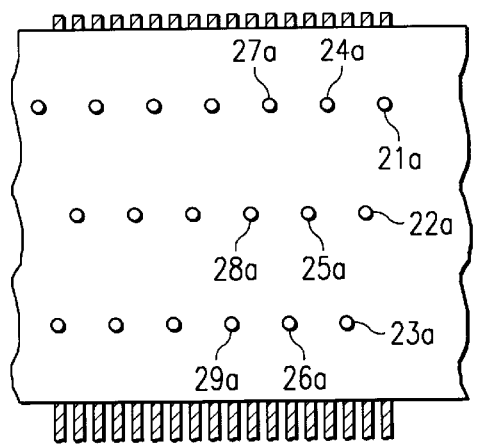
FIG. 3 is a bottom view of the tie bar portion of FIG. 2.

A first embodiment of the invention as shown in FIGS. 1, 2 and 3 is implemented in the form of a single piece multilayer ceramic chip carrier of the quad flat pack with tie bar that can be used in current semiconductor device production processes and installed equipment base. The single piece multilayer ceramic chip carrier has a metallized chip mount pad onto which a semiconductor chip is attached. For the example shown in FIG. 1, the chip mount pad 10 is about 14 mm square shaped and made of ceramic with gold flash metallization (for electrical connection to ground). Electrically separate from the chip mount pad are the multitude of metal lines connecting to the lead segments 11 (which are often simply referred to as "leads"). For the example in FIG. 1, the metal lines are laid out on double layer ceramic so that they connect to 288 leads arranged on four sides, with 72 leads on each side, and are made of gold or copper with gold flash. The leads are substantially arranged in a plane; as defined herein, the term "plane" refers to that plane of lead arrangement which is also the plane of the chip mount pad.

The leads in FIG. 1 have approximately a length of 18 mm, a width of 0.2 mm, a thickness of 0.15 mm, and a pitch of 0.5 mm. They are made of iron-nickel-cobalt alloy with nickel plating followed by gold plating. In other ceramic quad flat packs with tie bars, these leads may number in the 60 to 400 range, exhibit a length in the 15 to 20 mm range, and a pitch from 0.65 to 0.4 mm, but it is difficult, for reasons of fabrication as well as application, to reduce the pitch under 0.5 mm.

Known technology has recognized the need for mechanical support of those ends of the leads, which are farthest away ("remote") from the chip mount pad, in order to prevent mechanical damage such as bending, tilting, twisting, etc. Such support bars, or tie bars, usually have the shape of simple cuboids, which includes that they have "equal thickness" between respective surfaces. Tie bars are typically made of insulating material such as ceramic, FR4, epoxies, or other plastics. Their width usually falls in the 4 to 6 mm range. Semiconductor devices are then electrically tested. After the testing, the support bars are no longer needed; they are excised and discarded. The remaining lengths of the leads are formed into gull wings or other shapes suitable for attaching the semiconductor device to the wiring board (often using solder or solder paste).

It is challenging to contact the long, mechnically sensitive leads for testing purposes. Known technology has employed small needles, clamps, or traditional single coil springs—among other objects—to reliably establish contact to these leads without distorting or damaging their configuration (at 0.5 mm lead pitch, the industry requirement for coplanarity is 0.075 mm, at 0.4 mm lead pitch the coplanarity would have to be 0.065 mm) (for comparison, the thickness of a human hair is in the 0.1 to 0.3 mm range). To meet these requirements is demanding even at a lead pitch of 0.65 mm.

The present invention solves the dilemma, how to make contact for testing without causing distortion or coplanarity problems, in a two-prong approach. First of all, the width of the support bars, conventionally 4.5 to 5.5 mm, is widened. As shown in FIG. 1, the support bars 12 according to the invention now have trapezoidal portion 13 added to the conventional cuboid part, thus extending the width of the support bars typically into the 10 to 12 mm range, this means to twice or more, if possible, of the standard width. Consequently, a considerably larger fraction 14 of leads 11, than in conventional packages, can now be supported by the support bars. This tie bar solution is shown in FIG. 1. The tie bars are made of electrically insulating material such as ceramic, FR4 board, epoxy, or plastic compounds.

Secondly, this larger portion of the leads supported by the insulating tie bar can now be exploited to expand the pitch of the leads for testing purposes. To illustrate this embodiment of the invention, FIG. 2 shows an enlargement of leads 11 in FIG. 1, as their portions 14 are supported by the insulating tie bar 12. A group of leads has been removed in FIG. 2 to allow a view of how the tie bar 12 looks under the leads 11. As FIG. 2 indicates, there is an array of vias 15 fabricated into tie bar 12. These vias are electrically conductive channels, with a cross section comparable to the lead pitch, from one surface to the opposite surface of the electrically insulating tie bar, oriented approximately perpendicular to both surfaces. On the surface shown in FIG. 2, each lead is attached to one electrically conductive via. On the opposite surface, depicted in FIG. 3, the same group of vias appear with their electrically conductive surfaces so that they can be contacted during electrical testing.

Figure 4:
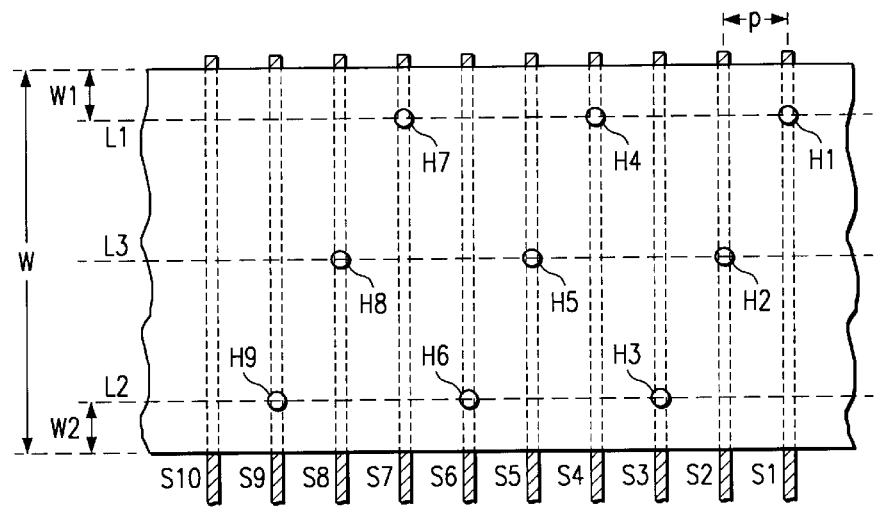
FIG. 4 is a schematical view helpful in understanding the sequence of design steps leading to the development of the via hole pattern in the tie bar.

The layout design of the array of vias is an important aspect of the invention to simplify the testing operation. On one surface of the tie bar, each via is attached to one package lead. On the opposite surface of the tier bar, each via will be contacted by a probe of the tester. The goal is to lay out the via array so that these contacting probes will have a much wider spatial separation from each other than they could obtain if they had contacted the leads directly. In other words the spatial separation of the probes with the help of the vias should result in an effective expansion of the lead pitch. In this fashion, the job of contacting the leads for testing purposes will be much simplified. To accomplish a layout of the array comprising maximum and equidistant separation of the vias from each other, one considers the leads as the "columns" in a grid, in which the tie bar edges and any line parallel to them represent the "rows". An exemplary method for constructing the layout design of the via array proceeds with reference to FIG. 4, as follows:

a) The selected package type determines the lead pitch "p" from one lead to the next.

b) The selected package determines the width "W" of the tie bar, widened according to the invention.

c) The selected tie bar material determines the minimum distances "w1" and "w2" from the respective two parallel tie bar edges, which have to be kept for reliably fabricating via holes and vias without cracking or otherwise damaging the tie bar material.

Step 1: Draw a line L1 at the distance w1 parallel to the tie bar edges.

Step 2: Mark each intersection of L1 with the leads as the first row of virtual via holes.

Step 3: Repeat the process for w2 and L2, obtaining a second row of virtual via holes.

d) Beginning with the first lead S1 of the group, select its intersection with line L1 as the location of via hole H1 assigned to lead S1.

e) Continuing with the adjacent lead S2, select its intersection with line L2 as the location for the via hole H2 assigned to lead S2.

f) Continuing with the adjacent lead S3, select its intersection with line L1 as the location for the via hole H3 assigned to lead S3. Notice: The return to L1 introduces a staggered via hole pattern.

g) The center-to-center distance H1 to H3 is equal to 2×p. Provide an algorithm comparing the distance H1 to H2 (or H2 to H3) with 2×p. If distance H1 to H2 is approximately 2×p, this staggered array of via holes is the preferred extension of the lead pitch for testing purposes, namely about 2×p. If distance H1 to H2 is significantly larger than 2×p, continue with Step 4.

Step 4: Divide the distance between L1 and L2 into two equal halves and draw line L3 parallel to the tie bar edges, obtaining a third row of virtual via holes at the intersections of L3 with the leads.

h) Beginning with the first lead S1, repeat process d). However, continuing with the adjacent lead S2, select its intersection with Line L3 as the location for the via hole H2 assigned to lead S2.

i) Continuing with the adjacent lead S3, select its intersection with line L2 as the location for the via hole H3 assigned to lead S3.

k) Continuing with the adjacent lead S4, select its intersection with line L1 as the location for the via hole H4 assigned to lead S4. Notice: The return to L1 introduces a staggered via hole pattern.

l) The distance Hi to H4 is equal to 3×p. Provide an algorithm comparing the distance H1 to H2 (or H2 to H3) with 3×p. If distance H1 to H2 is approximately 3×p, this staggered array of via holes is the preferred extension of the lead pitch for testing purposes, namely about 3×p.

If distance Hi to H2 is significantly larger than 3×p, continue with Step 5.

Step 5: Divide the distance between L1 and L2 into three equal parts, etc. etc. analogous to Step 4.

m) The comparison of distances in this new staggered array of via holes, analogous to process 1), will now be relative to 4×p.

In summary, the design of the via pattern has to satisfy two criteria simultaneously: The distance from each via hole to its set of nearest neighbors should be approximately equal, and should be a maximum. As demonstrated above, the location of the via holes are found sequentially at the intersections of columns and rows so that the columns are selected one after another in a continuous sequence starting with the first one, while the rows alternate back to the first one cyclically after their stepped sequence. The result is a staggered pattern of the array of via holes. It should be noted that alternate constructions are possible in order to identify via hole locations fulfilling the same two criteria.

After fabricating the via holes at their identified locations through the electrically non-conductive tie bar, they are filled with metal. A preferred choice is tungsten with gold-plated surface for easy attachment to the leads as well as for reliable contact to the testing connector. Other choices include, but are not limited to alloys of tungsten and titanium or molybdenum. As protective plating, platinum may be preferred on applications involving soldering.

Referring back to FIGS. 2 and 3 as an example of an actual device package, they show the correlation of package leads to the staggered array of vias. The leads in FIG. 2 are marked with reference numbers in order to correlate them with their respective vias shown in FIG. 3. Lead 21 is attached to via 21a, lead 22 is attached to via 22a. lead 23 to via 23a, and leads 24–29 are attached to vias 24a–29a, respectively. It is obvious that the pitch between leads 21 and 22 is now effectively much expanded to the pitch between vias 21a and 22b; the pitch between leads 22 and 23 is expanded to the pitch between vias 22a and 23a, and the pitch between leads 24–29 is expanded to the pitch between vias 24a–29a, respectively.

Another embodiment of this invention is depicted in FIG. 5. It is an apparatus used for positioning a semiconductor device for electrical testing, specifically intended for simplified application in automated testing equipment. It distinguishes itself from conventional contactors in a number of ways. In order to appreciate those differences it is important to keep in mind, what electrical testing of finished semiconductor products has to accomplish. Although testing as such is a non-value-added step in the production of semiconductor products, it is an essential part of the product because it hsas to quantify that the product meets the customer's specification. This requirement demands that testing must not distort the actual device parameters or the device performance. To keep the time, i.e. cost, of testing to a minimum, automated testing is preferred. Furthermore, testing should employ universal test sockets or contactors, as independent of device type as possible. These contactors should be non-destructive to the device. Test arrangements should require only low cost. The test contactor of FIG. 5 meets these goals.

In FIG. 5, device-to-be-tested 50 (for instance a ceramic Quad Flat Pack with tie bars 51, as shown in FIG. 1) is loaded into the electrically insulating base 52. In this process, metal-filled via holes 51a get in contact with metal pins 56. As will be discussed in more detail below (FIG. 6), metal pins 56 are part of a subassembly housed in bores 55 of base 52 (actually, bores 55 consist of two distinct parts with different diameters, described below in FIG. 6), and rest on elastic and electrically conductive supports 57. These supports, in turn, contact connector 58, which is leading into the tester. After device loading, electrically insulating lid 54 is closed in order to hold device 50 against base 52. Lid 54 has no latches or hinges, but base 52 is actually attached to stand 53 which has hinges 53a attached. When they are closed into notches 54a of lid 54, pressure is applied to tie bars 51 so that spring-like supports 57 are activated, thus providing contact pressure to device-to-be-tested 50. Reliable elctrical connection is thus established between device 50, via holes 61a, metal pins 56, sping-like support 57, and connector 58 to the tester.

The test apparatus of FIG. 5 is unique among existing test holders, since its outline fits neatly into the space available in commercial automated testers. Obviously, it can also be employed for manual testing.

It should be noted that subassembly 55, 55a and 55b in FIG. 6 is shown at a much enlarged scale compared to the remainder of the device holder depicted in FIG. 5. While this is necessary to explain the key functioning of this embodiment of the invention, a more realistic representation using a uniform scale for all parts is presented below in conjunction with FIGS. 9 and 10.

An example of an individual subassembly of FIG. 5 is displayed in more detail in the cross section of FIG. 6. Like parts are repeated with the same reference numbers. FIG. 6 shows bore 55 manufactured in the contactor base 52. Bore 55 comprises two parts with two different diameters: Part 55a, facing the device-to-be-tested, exhibits a smaller (about one half) diameter than part 55b, which faces connector 58. Examples of preferred dimensions are: Wide bore: Diameter 0.60 to 0.65 mm, length 1.8 to 1.9 mm; narrow bore: Diameter 0.30 to 0.35 mm, length 0.40 to 0.45 mm. Within bore 55 is a subassembly of a metallic pin 56 (described in more detail in FIG. 7), resting with its head 56b on an elastic and electrically conductive support 57 within the wider bore 55b. The diameters of stem 56a and head 56b of the pin are slightly smaller than the respective diameters of the bore so that the pin can move freely along the axis of the bore, with pin stem 56a moving in the narrower bore 55a. Furthermore, support 57 contacts a metallized pad on connector 58 leading to the tester. This connector is held between base 52 and stand 53. In another application, stand 53 with metallized pad 58 may actually be the test board of the electrical tester.

Metal pin 56 is preferably made of gold-plated copper alloy. If magnetic properties are no concern, other material choices for pin 56 include gold-plated steel or iron-rich alloys, or chromium-clad steel. Support 57 is elastic and electrically conductive; it may consist of a bundle of randomly oriented and densely packed elastic fibers (non-corrodable material, preferably gold-berrylium-copper alloy, or gold-plated copper), giving no preference to any single resonate frequency in electrical testing. As examples, suitable supports are supplied under the trade name Fuzz Button® by Tecknit®, Cranford, N.J. Example of preferred dimensions: Length 1.5 mm, diameter 0.5 mm. Together with pin 56, the complete subassembly is non-selective for electrical frequency in electrical tests. It should be noted in FIG. 6 that the dimensions of the total subassembly consisting of support 57, pin head 56b and pin stem 56a have to be such that stem 56a protrudes for a length approximately equal to the stem diameter outside of the narrow bore hole 56a whenever no pressure is applied unto the tip of the pin.

FIG. 7 illustrates details of the pin shown in FIG. 6. Metal pin 56 is cylindrical; examples of preferred dimensions are: Stem 56a: Diameter 0.23 to 0.27 mm, length 0.70 to 0.80 mm; head 56b: Diameter 0.55 to 0.60 mm, length 0.33 to 0.43 mm. Suitable pins are supplied by Zet-Tek company. The tip of the pin has a contour adapted for reliably contacting the metallic end connectors of a semiconductor package. In the example shown in FIG. 7, the tip has a concave surface contour 63, resulting in a surface ring 62. This surface contour is particularly suited to contact the solder balls protruding from Ball Grid Array packages. A flat contour of pin stem 56a is more suited to contact the formed ends of gull-wing lead packages.

Figure 8A:
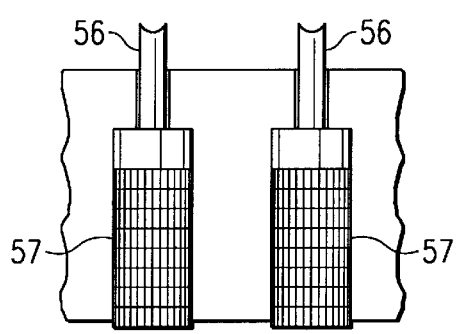
FIGS. 8A and 8B show schematically two of the subassemblies of metal pin and support in the bores extending through the contact base of the apparatus of FIG. 5. Intermediate leads are omitted for clarity.
Figure 8B:
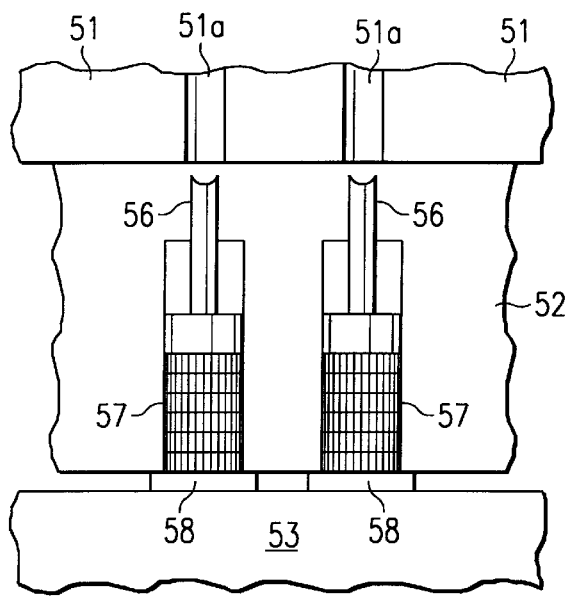

FIG. 8A shows two metal pins 56 positioned on their respective elastic and electrically conductive supports 57 before a semiconductor device has been loaded onto contactor base 52 for testing. The pin tips exhibit the concave contour shown in FIG. 7 and protrude a certain distance from their respective bore holes. FIG. 8B shows the same two metal pins 56 on their respective supports 57 after contactor base 52 has been placed on stand 53 and the tie bar 51 of a semiconductor device has been loaded for testing. Each pin lip is contacting a metal-filled via hole 51a. The pressure applied to the tie bar of the semiconductor device pushes the pins into the bore until tie bar 51 rests flash on base 52, causing pins 56 to make reliable contact to via holes 51a and thus to the semiconductor chip inside the package. Due to the force on the pins, elastic supports 57 are now compressed so that they reliably contact metallizations 58 of the connector leading to the tester. Connector 58, in turn, is positioned on stand 53.

With this method, reliable, low noise contact has been achieved for testing without the need to increase any lead length by long contact needles etc. Avoiding excessive contact lengths means avoiding artificial inductance paths. Furthermore, contact resistance is low.

Together, the result is significantly reduced electrical test noise with ability for higher frequency device testing. In addition, the pins as discussed in FIGS. 6, 7, and 8 are not fragile, thus avoiding excessive mechanical failure. The pin design allows increased alignment flexibility and contact reliability. The contact assembly is simple and allows accurate device lead contact without the need for lead combs or extra alignment features found in most of the conventional contactors, thus helping to solve problems associated with device lead coplanarity and package thermal expansion properties.

Figure 9:
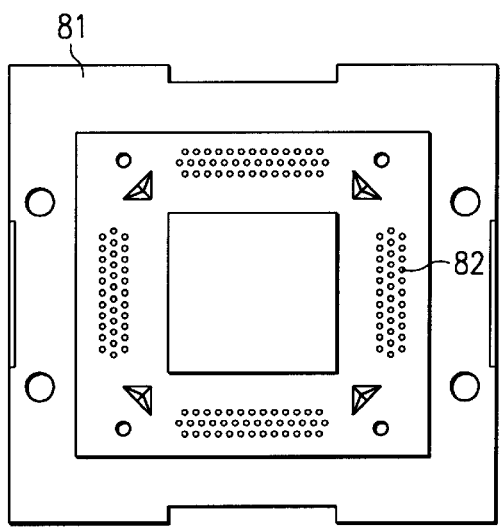
FIGS. 9 and 10 illustrate the top and bottom views, respectively, of the base part of the apparatus of FIG. 5, showing yet another embodiment of the invention.
Figure 10:
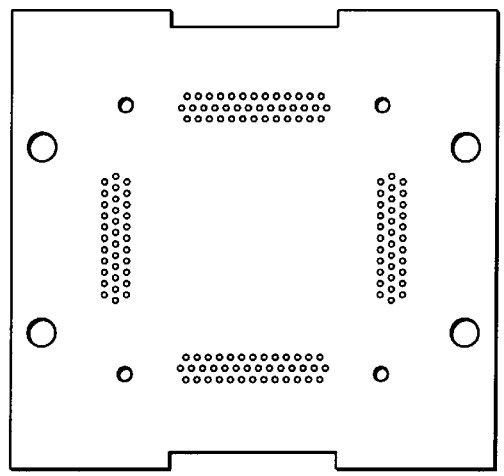
Figure 11:
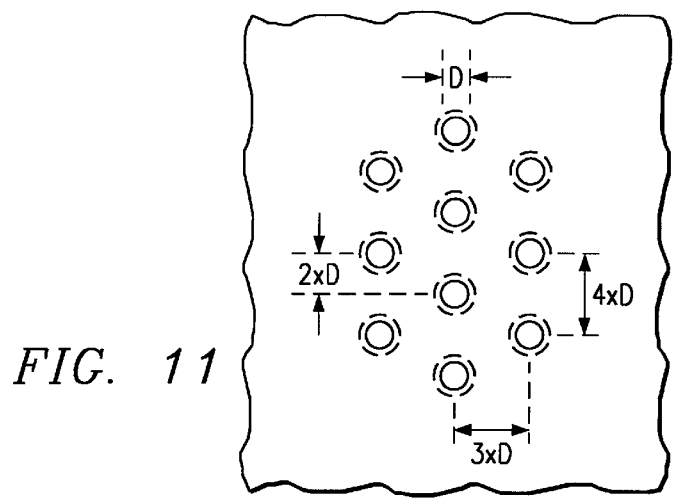
FIG. 11 shows the geometrical layout detail of part of the array of bores in FIG. 9, indicating the diameters of the top and bottom parts of the through-holes, and the relative distances of the bores.

An example of an actual contactor base with the multitude of bores in its insulating material is illustrated in more detail in FIGS. 9, 10, and 11. For a ceramic Quad Flat Package with tie bar, FIG. 9 shows the top view of quadratic contactor base 81 with three rows of bores 82 along each side in a staggered array pattern (total of 288 bores). In a preferred embodiment, the outer side length measures 81.25 mm, the center window side length 35 mm. These dimensions may vary according to the package tpye and number of leads. The bottom view of the same contactor base is depicted in FIG. 10. FIG. 11 gives a geometrical example of a staggered arrangement of bores, depicting the top view of the bore openings in solid outline; the dashed lines refer to the wider bore diameter). For the geometries of FIG. 11, with the small diameter of a bore opening called D, the array pattern for approximately equal distance between each bore to its surrounding next neighbors may result in distances between bore rows alternatively 2 times D, 3 times D, and 4 times D.

Figure 12:
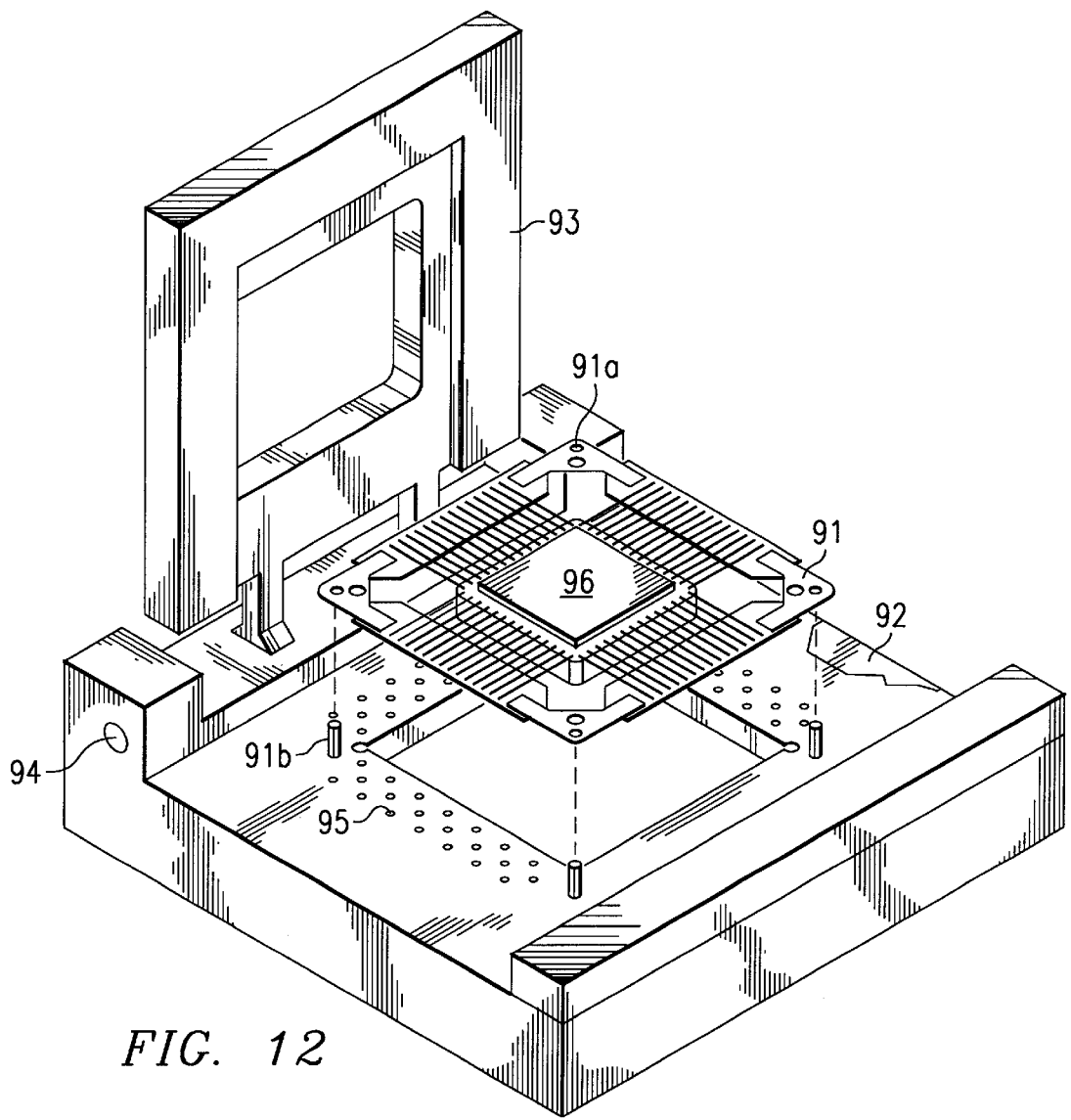
FIG. 12 is a perspective view of an apparatus for testing of semiconductor chip carriers according to another embodiment of the invention.

FIG. 12 illustrates another embodiment of the invention, in variation of the device holder shown in FIG. 5. Device-to-be-tested 91 including chip 96 (for instance a device of the Quad Flat Pack family with tie bar, is loaded into the electrically insulating base 92. Holes 91a and pins 91b insure proper positioning and alignment. Base 92 has parallel top and bottom surfaces. After loading, electrically insulating lid 93 is closed in order to hold device 91 against base 92. Contactor base 92 has no latches or hinges, is non-actuated, has lowq profile, and is readily adapted to automated device handlers; it can be used for high speed production tests as well as hand-test engineering evaluations. Contactor lid 93 is pivotally attached to base 92 and biased into the closed position by a spring 94 to be activated in the process of closing, thus providing contact pressure to device-under-test 91. The apparatus of FIG. 12 requires no "push and release" action to actuate the mechanism which would be difficult to perform with automated equipment. Zero insertion force is achieved without the need for ectra hardware. As a main characteristic, base 92 exhibits array 95 of bores extending from top to bottom surfaces. The array is arranged in the staggered pattern discussed above. The bores contain the electrically conductive and mechnically elastic subassemblies discussed earlier.

Since the invention has been described with respect to specific preferred embodiments thereof and many variations and modifications will immediately become apparent to those skilled in the art, it is the intention that the appended claims be interpreted as broadly as possible in view of the prior art to include all such variations and modifications.

What is claimed is:

1. A package for use with surface mount semiconductor circuits comprising:

a chip mount pad;

a multitude of leads in substantially the same plane as said chip mount pad;

a plurality of tie bars supporting said leads at their ends remote from said chip mount pad;

said tie bars having equal thickness, being made of electrically insulating material, and containing electrically conductive material in via holes from one surface to the opposite surface;

said tie bars having their respective surfaces aligned in the plane of said leads; and said leads being attached to the respective surfaces of said tie bars so that each lead is electrically in contact with one via respectively.

2. The package according to claim 1 wherein said vias are positioned so that the distance from each via hole to adjacent via holes is approximately equal.

3. The package according to claim 1 wherein said via holes are filled with metal, comprising tungsten with gold-plated surfaces.

4. The package according to claim 1 wherein said tie bars are made of electrically insulating materials comprising ceramic, organic or inorganic compounds.

5. A semiconductor device comprising:

a package with chip mount pad and a multitude of leads in a plane, having respective ends of each lead attached to one electrically conductive via in the electrically insulating tie bars;

a circuit chip mounted on said chip mount pad and wire bonded to metallizations connecting to said leads, remote from said tie bars, thus enabling electrical access to the chip from the vias in said tie bars.

6. The semiconductor device according to claim 5 wherein the electrical testing is performed by contacting the metal surface of the vias on the tie bar surface opposite to the attached leads.

7. An apparatus for positioning a semiconductor device for electrical testing comprising:

an electrically insulating base for receiving and holding the semiconductor device-to-be-tested;

an electrically insulating lid for holding the device against the base;

said base having a plurality of bores extending from top to bottom surfaces;

said bores having locations aligned with the locations of the metallic end connectors of said semiconductor device-to-be-tested said bores containing electrically conductive and mechanically elastic fibers;

said bores also containing metal pins having surface contours adapted for contacting both the metallic end connectors of said semiconductor device-to-be-tested, and the metallic areas of the tester connector; and said base having latches attached for grasping the lid after receiving said device-to-be-tested.

8. A method of positioning a semiconductor device for electrical testing, using an apparatus as defined in claim 7, comprising:

opening the lid by lifting it from the base;

loading the semiconductor device onto the base, establishing electrical contact between the metallic end connectors of the device-to-be-tested and the bores in the base, the bores containing electrically conductive and mechanically elastic fibers;

positioning the test connector into electrical contact with said pins in said bores;

closing the lid by positioning it back over the base; and closing the latches of the base onto the lid, thus activating the mechanical elasticity of said fibers and exerting force for pressuring the device-to-be-tested against the contoured surface of said pins for the electrical testing.

9. A method of positioning a semiconductor device for electrical testing, using an apparatus as defined in claim 8, comprising:

opening the lid by rotating it around the pivot attached to the base;

loading the semiconductor device onto the base, establishing electrical contact between the metallic end connectors of the device-to-be-tested and the bores in the base, the bores containing electrically conductive and mechanically elastic fibers;

positioning the test connector into electrical contact with said pins in said bores in said base; and closing the lid, thus activating its spring to exert force for pressuring the metallic end connectors of the device-to-be-tested against the contoured surface of said pins for the electrical testing.

10. The method according to claim 8 or claim 9 wherein all handling and positioning is performed by automated handling equipment.

11. An apparatus for positioning a semiconductor device for electrical testing comprising:

an electrically insulating base with parallel top and bottom surfaces for receiving and holding the semiconductor device-to-be-tested;

an electrically insulating lid for holding said device against said base;

said lid being pivotally attached to said base and biased into the closed position by a spring to be activated in the process of closing;

said base having bores extending from top to bottom surfaces;

said bores having locations aligned with the locations of the metallic end connectors of said semiconductor device-to-be-tested;

said bores containing electrically conductive and mechanically elastic fibers; said bores also containing metal pins, said pins having surface contours adapted for contacting both the metallic end connectors of said semiconductor device-to-be-tested, and the metallic areas of the tester connector.

12. The apparatus according to claim 11 wherein said metal pins are made of gold-plated copper alloy.

13. The apparatus according to claim 11 wherein said metal pins are cylindrical and comprise two parts having different diameters.

14. The apparatus according to claim 11 wherein said metal pins comprise concave tip surface contours.

* * * * *